United States Patent [19]
Brown

[11] Patent Number: 5,891,606
[45] Date of Patent: Apr. 6, 1999

[54] METHOD FOR FORMING A HIGH-DENSITY CIRCUIT STRUCTURE WITH INTERLAYER ELECTRICAL CONNECTIONS METHOD FOR FORMING

[75] Inventor: Vernon L. Brown, Barrington, Ill.

[73] Assignee: Motorola, Inc., Schaumburg, Ill.

[21] Appl. No.: 727,832

[22] Filed: Oct. 7, 1996

[51] Int. Cl.$^6$ ........................................... G03F 7/00
[52] U.S. Cl. .............................. 430/312; 216/18; 427/98; 430/314; 430/315
[58] Field of Search .................. 438/667; 427/97, 427/98; 216/18; 430/312, 313, 314, 315

[56] References Cited

U.S. PATENT DOCUMENTS

| | | | |
|---|---|---|---|
| 4,131,516 | 12/1978 | Bakos et al. ............................... | 427/97 |
| 4,902,610 | 2/1990 | Shipley ..................................... | 430/312 |
| 5,161,403 | 11/1992 | Kitchens ................................... | 72/414 |
| 5,162,144 | 11/1992 | Brown et al. ............................. | 428/209 |
| 5,246,817 | 9/1993 | Shipley, Jr. ............................... | 430/312 |
| 5,260,170 | 11/1993 | Brown ....................................... | 430/315 |
| 5,681,485 | 10/1997 | Yamagami et al. ........................ | 216/13 |
| 5,699,613 | 12/1997 | Chong et al. .............................. | 427/97 |

*Primary Examiner*—John A. McPherson
*Attorney, Agent, or Firm*—Douglas D. Fekete; John MacIntyre

[57] ABSTRACT

A process for forming a double-sided or multi-layered circuit structure entailing the use of a fill material that forms a conductive connection between the layers of the circuit structure and photodefinable resins that form permanent dielectric layers and plateable surfaces of the circuit structure. The method includes forming a through-hole in a substrate, and then filling the through-hole with the fill material containing a metal that is catalytic to electroless copper. The fill material forms an electrical connection having oppositely-disposed connection surfaces that are coextensive with opposite surfaces of the substrate. A first photodefinable dielectric layer is then formed on each surface of the substrate, including the connection surfaces, and openings are photoimaged and developed in the dielectric layers to expose a portion of each connection surface. A second dielectric layer is then formed over each of the first dielectric layers and the exposed portions of the connection surfaces, with an opening being formed in each of the second dielectric layers to re-expose the portions of the connection surfaces and contiguous surface portions of the first dielectric layers. The exposed surface portions of the first dielectric layers and the exposed portions of the connection surfaces are then electrolessly plated with copper to form conductor traces on each side of the substrate. As a result, the traces electrically contact the connection surfaces, such that traces on opposite sides of the circuit structure are interconnected with the connection formed by the fill material in the through-hole.

17 Claims, 4 Drawing Sheets

FIG.1
— PRIOR ART —
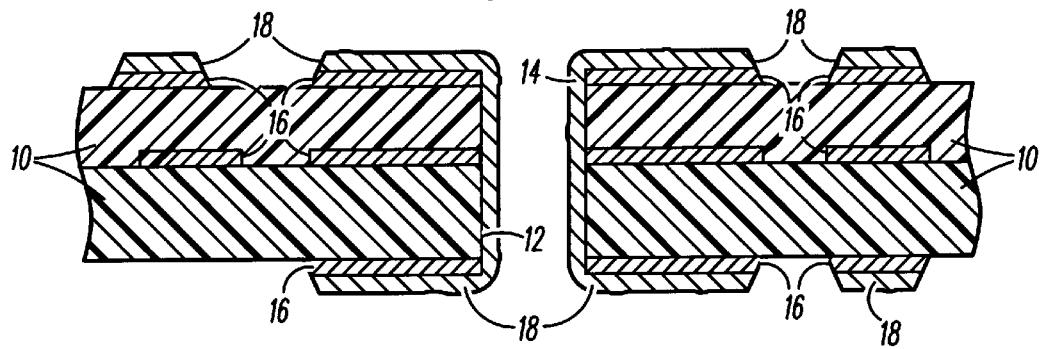
FIG.2A
— PRIOR ART —
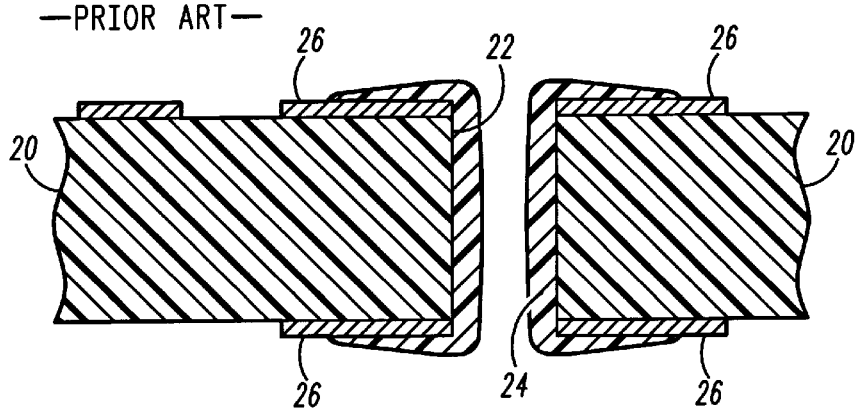
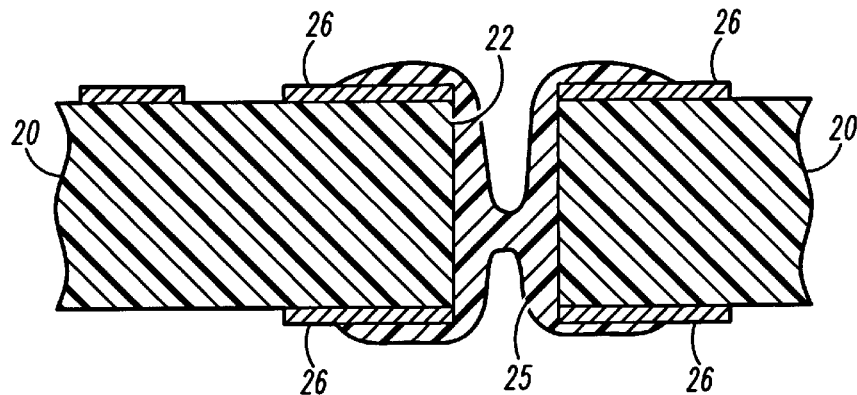
FIG.2B
— PRIOR ART —

5,891,606

1

METHOD FOR FORMING A HIGH-DENSITY CIRCUIT STRUCTURE WITH INTERLAYER ELECTRICAL CONNECTIONS METHOD FOR FORMING

FIELD OF THE INVENTION

The present invention generally relates to double-sided circuit boards and their fabrication. More particularly, this invention relates to a method for forming side-to-side electrical connections through a double-sided circuit board, wherein the method promotes interconnection density, eliminates processing constraints and reduces processing complexity conventionally associated with the manufacture of double-sided circuit boards.

BACKGROUND OF THE INVENTION

In the prior art, the interconnection density of double-sided circuits, such as laminated epoxy printed wiring boards (PWB) and printed circuit boards (PCB), has been limited by the plated through-holes (PTH) and polymer thick-film (PTF) inks required to electrically interconnect the circuitry on the opposite sides of the circuit structure. As used herein, a double-sided circuit board is a circuit board having conductor traces on opposite surfaces of the circuit board with electrical interconnection between the conductor traces at the opposite surfaces, and includes multi-layered boards (MLB) having electrical interconnections between at least two of its layers. Plated through-holes have been commonly used to form side-to-side connections of double-sided circuits, with PTF inks being employed where low interconnection densities are permitted. A plated through-hole is illustrated in FIG. 1, while a through-hole filled with a PTF ink is illustrated in FIGS. 2A and 2B. As shown in FIG. 1, a through-hole 12 is formed by drilling through a multi-layered board formed by two copper-clad laminates 10. The through-hole 12 is electroplated with copper to form a side-to-side interconnect 14 that electrically interconnects copper cladding 16 of the different layers of the multi-layered board. To ensure that the portion of the interconnect 14 within the through-hole 12 is sufficiently thick, the copper must be deposited at relatively low current densities over a relatively long period. As such, during the electroplating process, a copper layer 18 of appreciable thickness is also deposited on the exposed copper cladding 16, thereby increasing the effective thicknesses of conductor traces formed by the cladding 16.

From FIG. 1, it can be appreciated that PTH techniques limit circuit density because of the difficulty with which the cladding 16 and its overlying copper layer 18 are patterned to produce narrow traces desired for high density interconnections. Furthermore, the circuitry and its conductor traces must accommodate both the through-hole 12 and the interconnect 14 at the surface of the circuit layer, the diameters of which are dependent on the mechanical method by which the through-hole 12 is formed.

Two versions of the PTF technology are illustrated in FIGS. 2A and 2B, each example using a copper-clad laminate 20 through which a through-hole 22 has been formed by punching. FIG. 2A is the more common technique, and shows a side-to-side connection 24 formed with an electrically-conductive PTF ink that was screen-printed and then cured. The connection 24 electrically interconnects pads formed by etched copper cladding 26 on opposite surfaces of the laminate 20. Shrinkage during curing occurs to the extent that the connection 24 is limited to the wall of the through-hole 22. In contrast, the connection 25 shown in FIG. 2B plugs the through-hole 22 as a result of a greater amount of PTF ink being screen printed into the through-hole 22. Plugged connections 25 of the type shown in FIG. 2B are desirable if the circuit board is to be held by vacuum during manufacturing or if it is desired to prevent solder masks or other liquids from migrating from one side of the board to the other.

As can be appreciated from FIGS. 2A and 2B, circuit density is limited by the use of PTF technology as a result of the requirement for the relatively large-sized through-holes 22 required to be compatible with screen printing processes. As with connections formed by PTH techniques, PTF techniques also require that the conductive material that forms connections 24 and 25 must also cover a portion of the cladding 26 on both sides of the laminate 20 in order to promote a reliable side-to-side connection. Therefore, and again similar to PTH techniques, the circuitry and its conductor traces formed with the cladding 26 must accommodate both the through-hole 22 and the connections 24 and 25 in the circuit layer, because the traces cannot directly overlie the through-hole 22 or the connections 24 and 25.

A somewhat different process known in the art is illustrated in FIG. 3. This process entails filling a through-hole 32 with a conductive paste to form a connection 34 in a laminate 30 clad with copper foil 36. Following appropriate surface treatment, the surfaces of the entire laminate 30, including the connection 34 and the foil 36, are electrolessly plated to provide electrical continuity, then electroplated to form an additional copper layer 38 that adheres to both the connection 34 and the copper foil 36. Thereafter, the copper layers 36 and 38 are together selectively etched to form traces for circuitry on opposite sides of the laminate 30.

As with PTH and PTF techniques, the prior art of FIG. 3 is encumbered by density limitations—namely, the technique illustrated in FIG. 3 requires a copper layer 38 surrounding and overlying the connection 34 in order to form a conductive bridge between the connection 34 and the copper foil 36 immediately surrounding the connection, such that electrical continuity is achieved between the connection 34 and traces formed by the foil 36. Notably, density limitations are somewhat less severe, since the copper foil and layer 36 and 38 overlying the connection 34 can be etched to form a trace, contrary to the prior art of FIGS. 1, 2A and 2B.

As can be appreciated from the above prior art processes, the density of a double-sided or multi-layered circuit board has been limited in part by the techniques required to make side-to-side and interlayer connections. Specifically, prior art methods have required plating (FIGS. 1 and 3) and cured conductive polymers (FIGS. 2A and 2B) to form an electrical bridge between the connection and copper layers immediately surrounding the connection, with the result that the connection also occupies a signification portion of the surface surrounding the through-hole. With these prior art methods, the above is further exacerbated by the requirement that the size of the copper layers surrounding the connection be sufficient to accommodate misregistration of the plating pattern to the connection due to manufacturing and processing tolerances.

Furthermore, the density of circuits formed by the techniques of FIGS. 1 and 3 is limited by the resulting thick copper layers from which traces must be etched. The density of circuits formed by the techniques of FIGS. 1, 2A and 2B is also limited because traces cannot directly overlie the connection.

Filled side-to-side through-hole connections are utilized in the manufacture of co-fired ceramic circuit boards.

However, the refractory metal pastes used with this technology to form the side-to-side connections are incompatible with printed wiring board and printed circuit board processing and material capabilities. Furthermore, the conductor traces associated with the side-to-side connection must be screen printed on the surface of a ceramic circuit board after filling the through-hole, but prior to firing the ceramic structure, to make connection to the filled through-hole. The resulting traces are invariably larger than their corresponding side-to-side connections in a manner similar to the plated through-hole structure of FIG. 1.

From the above, it can be appreciated that as the desire for more dense circuits intensifies for applications such as consumer electronic products, there is a need to provide improved methods and techniques for forming through-hole connections that do not limit the precision with which conductor traces are formed or increase the spacing between adjacent conductor traces within a given circuit layer.

SUMMARY OF THE INVENTION

According to the present invention, there is provided a process for forming a double-sided printed circuit board characterized by increased circuit density as a result of the process by which side-to-side connections are formed through the layers of the circuit board. The circuit board essentially can be any type of circuit structure, including multi-layered boards and those used to form circuit packages. The substrate may further be formed to include etched copper conductors on one or both of its surfaces, and multiple circuit layers that are internally interconnected by one of several known connecting features.

More particularly, the invention entails an interconnection technique that does not result in a through-hole being present at the surface of the circuit structure, and therefore does not unnecessarily dictate the placement, width or thickness of traces on the interconnected layers, which may directly overlie the connection. As a result, the invention enables increased circuit density within every circuit layer of a circuit structure. The method generally entails the use of a conductive filler that forms a conductive connection between the layers of a multi-layered structure, and photodefinable resins that form permanent dielectric layers and plateable surfaces of the multi-layered structure. The connection of this invention provides a coextensive, or flush, surface over which the dielectric layers and plateable surfaces, and therefore the interconnected circuitry, may be formed.

The method includes forming a through-hole in a substrate and then completely filling the through-hole with the filler, which contains a metal that is or can be made catalytic to electroless copper, such as silver, copper, tin, nickel and palladium. As used herein, an electroless copper catalytic agent is a metal or metal composition that is or is capable of being rendered catalytic to electroless copper deposition. The filler forms an electrical connection having oppositely-disposed connection surfaces that are coextensive with opposite surfaces of the substrate. For this purpose, the filler preferably has a sufficient solids content to minimize shrinkage during processing of the filler and subsequent processing. Alternatively, the connection may be subsequently processed to yield the desired coextensive connection surfaces.

A first photodefinable resin is then deposited on each surface of the substrate, including the connection surfaces, to form an oppositely-disposed pair of first dielectric layers on the substrate. According to this invention, a preferred photodefinable resin for the first dielectric layers contains a catalytic filler of metal oxide particles that can be converted to form an electroless plating catalyst at the surface of each of the first dielectric layers. The first dielectric layers are then photoimaged and developed to form openings that expose a portion of each connection surface. A preferred aspect of this invention is that the openings are smaller than their connection surfaces so as to expose only a fraction of these surfaces. As such, the surface area available for interconnection with subsequently-formed circuitry is smaller than the cross-section of the through-hole. A second dielectric layer is then formed over each of the first dielectric layers and the exposed portions of the connection surfaces, with an opening being formed in each of the second dielectric layers to re-expose the portions of the connection surfaces and contiguous surface portions of the first dielectric layers. The exposed surface portions of the first dielectric layers and the exposed portions of the connection surfaces are then electrolessly plated with copper to form conductor traces on each side of the substrate. Importantly, the traces formed in this manner electrically contact the connection surfaces, such that traces on opposite sides of the circuit structure are interconnected with the connection formed by the filler in the through-hole. Additional layers of the first and second photodefinable resins can be deposited, photoimaged, developed and plated to form any number of circuit layers, such as in accordance with the teachings of U.S. Pat. No. 5,260,170 to Brown.

From the above, those skilled in the art will appreciate that the method of this invention overcomes the shortcomings of the prior art by enabling traces of a multilayer circuit board to be formed with interlayer connections to yield a dense double-sided or multi-layered circuit board. In particular, and contrary to prior art plated through-hole techniques, the improved method of this invention does not limit the precision with which conductor traces are formed because the traces are formed subsequent to the connection. In addition, the method of this invention does not artificially increase spacing between adjacent conductor traces because the connection is not accommodated at the surface of a circuit layer, but instead the traces are formed on the first dielectric layers overlying the connections. Accordingly, conductor traces associated with the side-to-side connection of this invention can be plated directly over a connection, and the openings through the first dielectric layers through which contact is made to the connection can be significantly smaller than the connection, contrary to prior art plated through-hole and printed thick-film techniques illustrated in FIGS. 1, 2A, 2B and 3. In addition, traces that must remain electrically insulated from the connection can also be formed adjacent the openings in the first dielectric layers yet directly over the connection, thereby greatly increasing circuit density.

Those skilled in the art will also appreciate that the method of this invention provides for lower cost and less complicated processing as compared to prior art side-to-side connection techniques. Because the diameters of the connections do not dictate trace spacing and location, the method by which the through-holes are formed is less critical. Furthermore, elimination of a plated through-hole avoids the slow and difficult plating process associated with plating relatively small through-holes.

BRIEF DESCRIPTION OF THE DRAWINGS

FIGS. 1, 2A, 2B and 3 represent side-to-side connections of the type employed in the prior art;

DETAILED DESCRIPTION OF A PREFERRED EMBODIMENT

Double-sided circuit boards that can be produced by the processing steps of this invention are generally represented in FIGS. 4 through 7, which illustrate multi-layered circuit structures in which layers of circuitry are interconnected by side-to-side connections through one or more layers of the circuit structure. The process described and represented in the FIGS. serves to illustrate advantageous features of this invention in reference to making interconnection to circuit layers on opposite sides of a circuit board, though it will be apparent to those skilled in the art that the invention is also generally applicable to multi-layered substrates in which internal layer connections to either side are desired. As such, those skilled in the art will appreciate that the present invention finds use in a wide variety of circuit structures, including ball grid array (BGA), micro-BGA, chip-sized packages and multichip modules where processing and packaging difficulties arise as a result of the requirement for a large number of interconnections.

Figure 3:
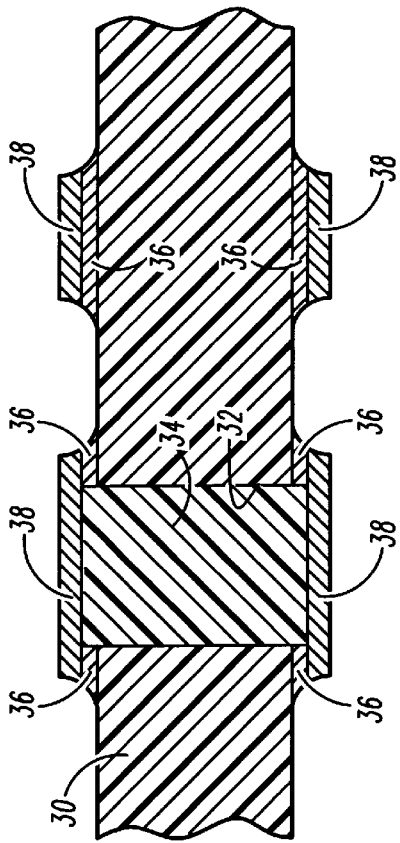
Figure 4:
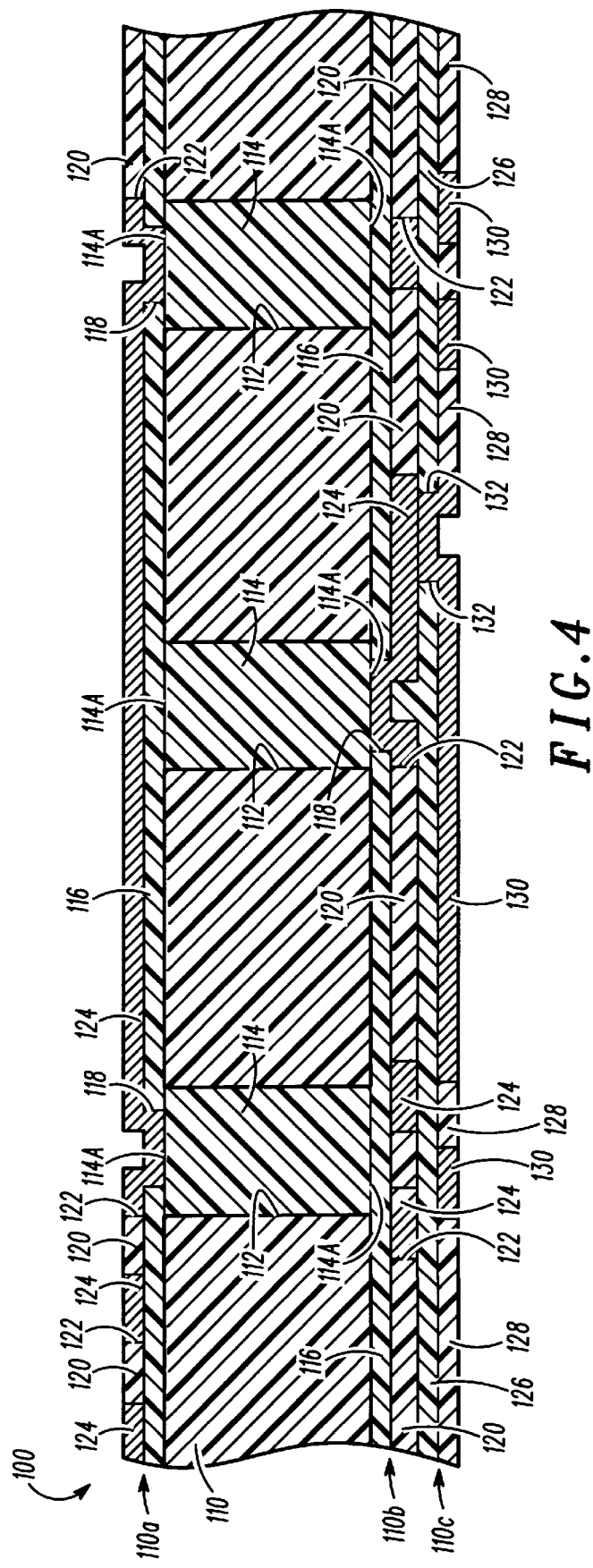
FIG. 4 is a cross-sectional view of a double-sided circuit board having side-to-side connections formed in accordance with processing steps of this invention.

Referring to FIG. 4, a double-sided, multi-layered circuit structure 100 is shown in cross-section. The structure 100 is formed by a substrate 110 having a single circuit layer 110a formed on one (upper) side and two circuit layers 110b and 110c formed on the opposite (lower) side. In the context of this invention, the substrate 110 can be formed of any suitable dielectric plastic material, including polymer-glass and polymer-paper laminate materials, though it is foreseeable that other suitable substrate materials could be used. As shown, three side-to-side connections 114 are formed within through-holes 112 present in the substrate 110, though the number and locations of the connections 114 will vary according to the requirements of the given application. The holes 112 may be formed by any suitable method, such as mechanical methods including drilling and punching, and may have diameters on the order of about 0.4 millimeter (about 0.015 inch) and less. The size of the holes 112 is tailored to enable the connections 114 to be formed by a conductive paste or ink material that is deposited in the holes 112 by screen or stencil printing, or by injection with appropriate equipment.

The ink material for the connections 114 necessarily contains a metal that is catalytic to electroless copper, and preferably has a solids content of nearly 100%, i.e., at least 95%, which is sufficient to ensure that the material will not excessively shrink during subsequent processing. According to this invention, preferred matrix materials for the connections 114 include polymers, such as an epoxy, while the metal is preferably a dispersion of a silver, copper, tin, nickel or palladium powder, or mixtures thereof. Ink materials having an epoxy as the matrix material require a curing step prior to subsequent processing of the circuit structure 100, which is within the scope of one skilled in the art. Due to the high solids content of the ink material, the resulting connections 114 form connection surfaces 114a that are substantially planar with, or may project slightly above, the surfaces of the substrate 110, in the sense that the connection surfaces 114a do not significantly affect the deposition and functional characteristics of subsequently deposited layers of the circuit layers 110a, 110b and 110c. Alternatively, the through-holes 112 may be intentionally overfilled with the ink material, and then rendered more planar with the substrate 110 by grinding.

In the processing of the double-sided circuit structure 100 of FIG. 4, a photodefinable resin layer 116 is formed on each surface of the substrate 110 so as to overlie each of the connection surfaces 114a. According to this invention, the resin layers 116 are preferably composed of a resin mixture containing a photosensitive material and a catalytic filler that, when the resin layers 116 are appropriately treated, yields a surface that is catalytic to electroless copper plating. The photosensitive material content of the resin mixture results in the resin layers 116 being photodefinable, such that photoimaging and development techniques can be employed to pattern openings 118 in the resin layers 116, as shown in FIG. 4. The resin component of the resin mixture can be any suitable liquid resin or solid resin dissolved in a solvent, so as to enable the resin mixture to be readily deposited onto the surfaces of the substrate 110 to form the resin layers 116. Resins that could be used include thermoplastic resins, thermosetting resins, elastomers and mixtures thereof, which when incorporated with a photosensitive material yield a photodefinable resin mixture. Desirable properties for the resin mixture include dielectric and physical properties that remain stable throughout deposition and photoimaging of the resin layers 116.

According to this invention, a preferred composition for the resin layers 116 is a photodefinable resin disclosed in U.S. Pat. No. 5,162,144 to Brown et al. and U.S. Pat. No. 5,260,170 to Brown, each of which is commonly assigned with this invention and incorporated herein by reference. In accordance with the teachings of Brown et al. and Brown, a suitable resin component for the resin mixture is an epoxy, while suitable photosensitive materials include a family of compositions available from Ciba-Geigy, Inc., under the trademark PROBIMER 61. Suitable photosensitivity is attained with the PROBIMER 61 material from a photoinitiator present in amounts of up to about 5 percent of the total epoxide molecules that are cross-linked in the final, totally cured resin layers 116. Differing amounts of photoinitiator are recognized as being useful depending on the specific resin formulation and image development process used. The catalytic filler is preferably metal oxide particles that constitute less than about ten weight percent of the resinoxide mixture. A preferred metal oxide is cuprous oxide, though other oxides or catalytic fillers could be used, including a catalytic material available from Johnson-Matthey of New Jersey, USA, under the trademark CAT-10.

The manner in which the resin mixture is deposited to form the resin layers 116 will depend to some degree on the particular resin component of the mixture. Due to the presence of the photosensitive material, the openings 118 in the resin layers 116 can be precisely photochemically defined through a mask (not shown) and developed in the resin layers 116 in a manner consistent with the resin. As shown in FIG. 4, the openings 118 are selectively sized to expose only a small portion of the connection surfaces 114a, with the resin layers 116 overlying a peripheral portion of each connection surface 114a. Alternatively, the openings 118 could be sized or shaped to expose any portion of the surfaces 114a. The openings 118 can be readily formed to have diameters of as small as about 25 micrometers (about 0.001 inch), compared to the connections 114 whose diameters are substantially larger as dictated by the holes 112 and the process by which the holes 112 are formed.

Following or concurrent with formation of the openings 118, a second pair of resin layers 120 is applied and patterned to form openings 122, as shown in FIG. 4. The second resin layers 120 can have a similar or compatible composition to that of the first resin layers 116, though not requiring a catalytic filler for the role served by the resin layers 120, which is primarily that of a permanent plating mask and dielectric layer. As shown, the openings 122 encompass both of the openings 118 in the first resin layers 116, including the connection surfaces 114a and portions of the first resin layers 116 surrounding the surfaces 114a. After the second resin layers 120 are photochemically patterned, the first and second resin layers 116 and 120 are simultaneously and sufficiently cured to be resistant to chemical attack. Alternatively, the first resin layers 116 may be applied and photodefined but without image development, followed by application and photodefinition of the second resin layers 120, after which the latent images of both resin layers 116 and 120 are developed to yield the result shown in FIG. 4.

Following development of the openings 122, the surfaces of the resin layers 116 are treated to become catalytic to the electroless copper bath. For this purpose, the resin layers 116 are subjected to attack by a chemical such as permanganate or by reactive ion etching to expose metal oxide particles at and near the surfaces of the resin layers 116. A reducing agent including borohydride is then applied in a starved manner to convert the exposed metal oxide particles at the surfaces of the resin layers 116 to islands of catalytic film having a surface resistivity of greater than about $10^6$ ohms per square. The amount of metal oxide in the resin layers 116 is preferably about ten weight percent or less, sufficient oxide is present to form a thin discontinuous catalytic film. This discontinuous film, composed of unconnected islands of catalytic film, assures that excessive and uncontrolled plating does not occur on the surfaces of the resin layers 116. Those skilled in the art will appreciate that, if the above steps of exposing and converting the particles is not performed, the resin layers 116 can be used to serve as a conventional solder mask that can be subjected to typical printed circuit manufacturing and service environments, including electroless plating, without effect or change.

The next step in the process of this invention is to electrolessly plate the catalytic surfaces of the resin layers 116 and the connection surfaces 114a with copper for a time sufficient to produce copper traces 124. As is apparent from FIG. 4, the second resin layers 120 serve as masks, such that only those portions of the first resin layers 116 and surfaces 114a exposed by the openings 122 in the second resin layers 120 are plated during exposure to the electroless copper bath. The result is well-defined copper traces 124 that electrically contact one or more of the side-to-side connections 114.

Alternatively, the traces 124 could be formed by electrolessly plating the first resin layers 116 prior to depositing the second resin layers 120, such that a continuous electroless copper layer overlies the connection surfaces 114a and the entire surface of each of the first resin layers 116. Thereafter, the electroless copper layer can be electroplated, and the second resin layers 120 deposited and patterned to form masks through which the electroplated copper is selectively etched to form the traces 124. The second resin layers 120 is then removed, yielding a structure similar to the upper circuit layer 110a shown in FIG. 4, but without the second resin layer 120. An alternative to the above sequence is to form the traces 124 directly from the electroless copper layer, i.e., omitting the step of electroplating the electroless copper layer.

Figure 5:
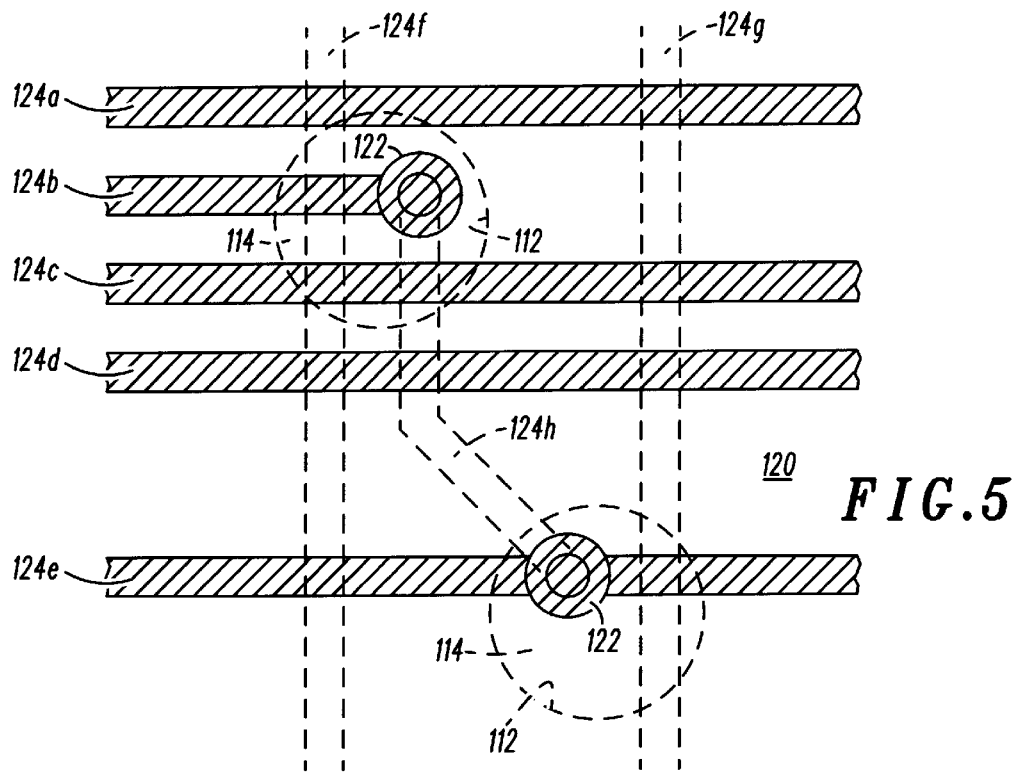
FIG. 5 is a plan view of a double-sided circuit board having side-to-side connections produced in accordance with the processing steps of this invention.

Because the copper traces 124 are defined on the photo-defined resin layers 116 overlying the connections 114, the traces 124 may also overlie the connections 114 without electrically contacting the connections 114, as illustrated by the traces 124a, 124c, and 124d shown in FIG. 5. Furthermore, FIG. 5 shows the openings 122 in the second resin layer 120 as being significantly smaller than the connections 114, which illustrates the extent to which placement and width of the traces 124 are not unduly dictated by the placement and size of the connections 114. Finally, conductor traces 124f, 124g and 124h are shown in FIG. 5 as being formed on the opposite side of the circuit structure 100, with selective connection being made by the trace 124h to traces 124b and 124e through each of the illustrated side-to-side connections 114.

With reference again to FIG. 4, the lower surface of the circuit structure 100 is shown as including a third circuit layer 110c formed by a dielectric resin layer 128 overlying a resin layer 126 formed by the same resin mixture as that used to form the photodefinable resin layer 116. In this manner, the resin layers 126 and 128 can be photoimaged and developed as described previously to enable one or more of the copper traces 124 to be interconnected to conductor traces 130 of the third circuit layer 110c. More particularly, the resin layer 126 is deposited over the resin layer 120 and the traces 124, an opening 132 is then patterned in the resin layer 126 through which a portion of one trace 124 is exposed. Thereafter, the resin layer 128 is deposited, photoimaged and developed to form a mask through which additional electroless copper is deposited to form the traces 130.

Figure 6:
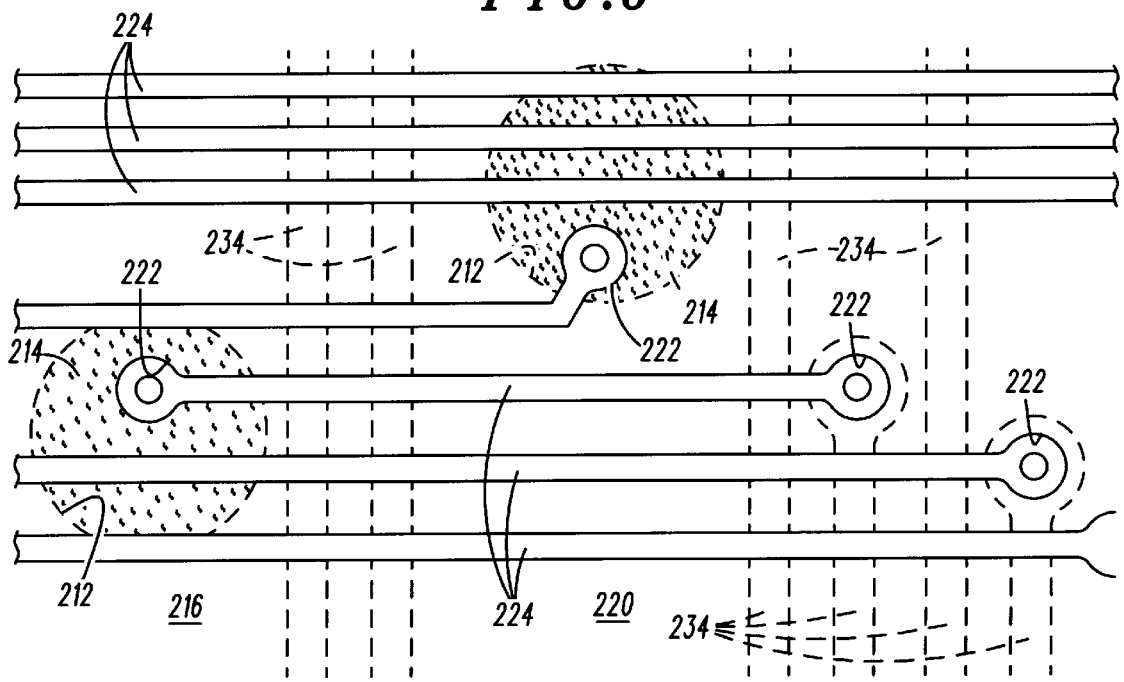
FIG. 6 is a plan view of a double-sided circuit board having an underlying etched circuit in combination with side-to-side connections produced in accordance with the processing steps of this invention.

FIG. 6 shows another aspect of this invention, illustrating the compatibility of the connection method with a substrate having an etched conductor pattern (illustrated by hidden lines) formed on one of its surfaces and therefore underlying resin layers 216 not in figure and 220. (Traces present on the opposite side of the circuit structure are not shown to promote clarity of the FIG.) In this respect, side-to-side connections 214 are shown as being located in the overlying deposited circuit structure to avoid electrical contact with underlying traces 234 of the etched conductor pattern, though it is foreseeable that intentional interconnection may be desired between the traces 234 and the connections 214.

In accordance with this embodiment of the invention, side-to-side connections 214 are made to the traces 224 of the deposited resin layers (only the second resin layer 220, corresponding to resin layer 120 of FIGS. 4 and 5, is visible) rather than the traces 234 of the etched conductor pattern. In this manner, a relatively low-cost etched layer can be used in combination with a deposited circuit layer. As illustrated in FIG. 6, it is apparent that the present invention completely avoids the prior art requirement to form an electrical bridge between a side-to-side connection and its associated circuitry using an oversized plated or thick-film pad (e.g., FIGS. 1, 2A, 2B and 3), with an attendant loss of circuit density. As a result, the etched traces 234 can closely approach the through-hole 212, and electrical contact with the connection 214 is achieved by the traces 224 through an area that is smaller than the cross-sectional area of the connection 214.

Figure 7:
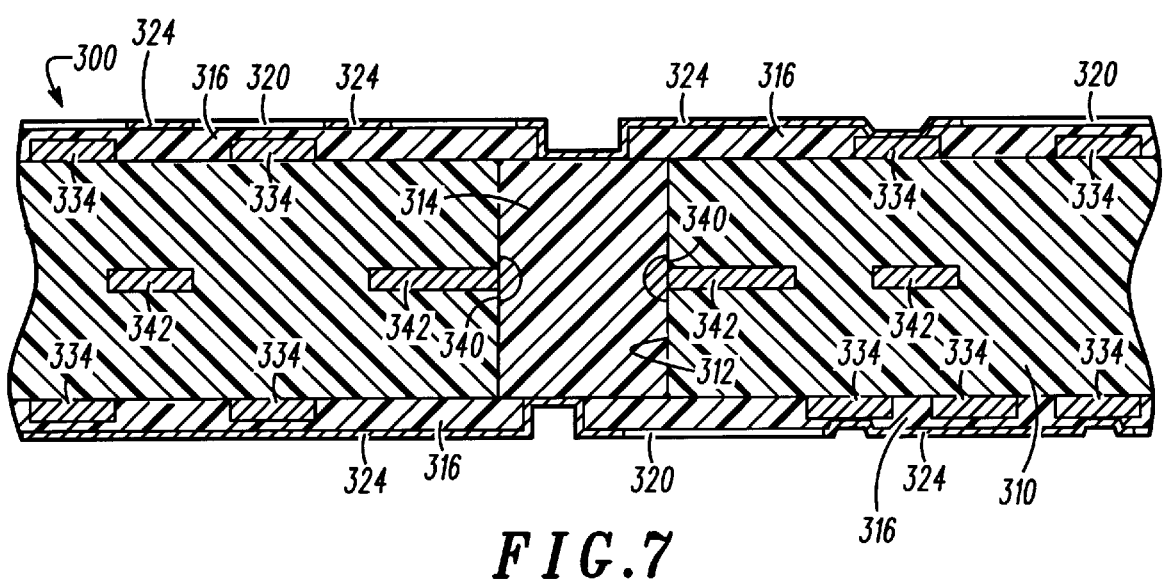
FIG. 7 is a cross-sectional view of a multi-layered substrate having a side-to-side connection formed in accordance with processing steps of this invention.

FIG. 7 shows another embodiment of this invention, in which electrical connection between an internal circuit layer and subsequently-formed layers of a multi-layered structure 300 is made with a connection 314 that has been formed within a through-hole 312 in a laminated substrate 310. An internal connection ring 340 is employed to enhance electrical contact between traces 342 of the internal circuit layer with the connection 314. The connection ring 340 is achieved by isolated plating of electroless copper or aggressive etching of the walls of the through-hole 312 where the traces 342 are exposed. FIG. 7 also illustrates that the connection 314 is electrically interconnected with traces 324 of a deposited conductor pattern formed by dielectric layers 316 and 320, as well as a trace 334 of an etched conductor pattern formed on the surface of the substrate 310.

From the above, it can be appreciated that the resulting circuit structures depicted in FIGS. 4 through 7 are characterized by traces having interlayer connections that yield a dense double-sided or multi-layered circuit board. Contrary to prior art plated through-hole techniques, the connections of this invention do not affect the thicknesses of the traces because the connections can be formed independently and prior to the traces. In addition, the connections do not dictate spacing between adjacent traces because the connections are not accommodated at the surface of a circuit layer, but instead are electrically insulated from the traces by the first-deposited resin layer. Accordingly, the traces can be plated directly over the connections, and the openings through the resin layers through which contact is made to the connections can be significantly smaller than the connections, contrary to prior art plated through-hole and printed thick-film techniques illustrated in FIGS. 1, 2A, 2B and 3.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A method for forming an interlayer electrical connection in a circuit structure, the method comprising the steps of:

fabricating a substrate having substrate surfaces and a through-hole extending between the substrate surfaces;

filling the through-hole with a filler containing a metal that is or is rendered catalytic to electroless copper deposition, the filler having oppositely-disposed connection surfaces, each of the connection surfaces being coextensive with a corresponding one of the substrate surfaces;

forming on the substrate an oppositely-disposed pair of first dielectric layers, the first dielectric layers having openings that expose a portion of each of the connection surfaces, the openings being smaller than their corresponding connection surfaces;

forming first conductor traces on the first dielectric layers and the connection surfaces to electrically connect the first conductor traces to the connection surfaces; and applying an intervening dielectric layer overlying the through-hole;

forming a second conductor trace adjoining the intervening dielectric layer, the second conductor trace overlying the through-hole and separated from one of the first conductor traces by the intervening dielectric layer.

2. A method as recited in claim 1 further comprising the step of:

forming an oppositely-disposed pair of second dielectric layers on each of the first dielectric layers and the portions of the connection surfaces prior to forming the first conductor traces, the second dielectric layers forming a mask for photo-defining boundaries of the first conductor traces and the second dielectric layers having openings that expose the portions of the connection surfaces and surface portions of the first dielectric layers contiguous with the portions of the connection surfaces;

wherein the step of forming the first conductor traces comprises electrolessly plating copper on the surface portions of the first dielectric layers and the connection surfaces so as to form the first conductor traces.

3. A method as recited in claim 2 wherein forming the intervening dielectric layer further comprises forming a third dielectric layer as the intervening dielectric layer on at least one of the second dielectric layers after the electroless plating step, the third dielectric layer being electrolessly plateable and overlying at least one conductor trace of said traces associated with the at least one second dielectric layer, the third dielectric layer being formed to have an opening that exposes an underlying portion of the at least one conductor trace;

forming a fourth dielectric layer on the third dielectric layer and the underlying portion of the at least one conductor trace, the fourth dielectric layer being formed to have an opening that exposes a portion of the third dielectric layer and re-exposes the underlying portion of the at least one conductor trace; and electrolessly plating the portion of the third dielectric layer and the underlying portion of the at least one conductor trace.

4. A method as recited in claim 1, wherein the step of forming the first conductor traces comprises the steps of:

treating at least one of the first dielectric layers to render it catalytic to electroless plating;

electrolessly plating copper to form an electroless copper layer that is continuous over the connection surfaces and the first dielectric layers;

applying and patterning a removable dielectric layer over the electroless copper layer;

selectively etching the electroless copper layer exposed by the removable dielectric layer so as to form the first conductor traces; and removing the removable dielectric layer.

5. A method as recited in claim 1, wherein the step of forming the first conductor traces comprises the steps of:

treating at least one of the first dielectric layers to render it catalytic to electroless plating;

electrolessly plating copper to form an electroless copper layer that is continuous over the connection surfaces and the first dielectric layers;

electroplating the electroless copper layer to form an electroplated copper layer that is continuous over the connection surfaces and the first dielectric layers;

applying and patterning a removable dielectric layer over the electroplated copper layer;

selectively etching the electroplated copper layer exposed by the removable dielectric layer so as to form the first conductor traces; and removing the removable dielectric layer.

6. A method as recited in claim 1 wherein the filler further comprises a polymer matrix in which the metal is dispersed, the method further comprising the step of curing the polymer matrix prior to forming the first dielectric layers, the filler having a sufficient solids content to minimize shrinkage during the curing step to the extent that each of the connection surfaces is coextensive with a corresponding one of the surfaces of the substrate.

7. A method as recited in claim 1 further comprising the step of grinding the filler after the filling step such that the connection surfaces are substantially planar with a corresponding one of the surfaces of the substrate.

8. A method as recited in claim 1 wherein the circuit structure is a double-sided circuit board.

9. A method as recited in claim 1 wherein the substrate is formed to include an etched conductor pattern on at least one of the surfaces thereof, wherein the first dielectric layers are formed over the etched conductor pattern.

10. A method as recited in claim 1 wherein the substrate is formed to include an internal conductor trace that is exposed within the through-hole during the step of forming the through-hole, whereby the electrical connection electrically contacts the internal conductor trace.

11. A method for forming a side-to-side electrical connection in a double-sided circuit structure, the method comprising the steps of:

forming a through-hole in a dielectric substrate having oppositely-disposed surfaces;

completely filling the through-hole with a polymer-based filler containing a metal that is or is rendered catalytic to electroless copper, the filler forming an electrical connection having oppositely-disposed connection surfaces, each of the connection surfaces being coextensive with a corresponding one of the surfaces of the substrate;

depositing a first photodefinable resin containing a catalytic filler on each of the surfaces of the substrate and on the connection surfaces so as to form an oppositely-disposed pair of first dielectric layers on the substrate, the catalytic filler comprising metal oxide particles that are convertible to form an electroless plating catalyst;

photoimaging and developing the first dielectric layers so as to form openings that expose a portion of each of the connection surfaces, the openings being smaller than their corresponding connection surfaces;

depositing a second photodefinable resin on each of the first dielectric layers and on the portions of the connection surfaces, the second photodefinable resin forming an oppositely-disposed pair of second dielectric layers on the substrate;

photoimaging and developing the second dielectric layers so as to re-expose the portions of the connection surfaces and surface portions of the first dielectric layers contiguous with the portions of the connection surfaces;

treating the surface portions of the first dielectric layers such that the metal oxide particles in the first dielectric layers are converted to form catalytic films that cause the surface portions to be electrolessly plateable; and electrolessly plating copper on the surface portions of the first dielectric layers and the connection surfaces so as to yield a double-sided circuit structure having conductor traces on each side thereof, the conductor traces being electrically interconnected by the electrical connection, applying an intervening dielectric layer overlying the through-hole on at least one side of the substrate;

forming a second conductor trace adjoining the intervening dielectric layer, the second conductor trace overlying the through-hole and separated from one of the first conductor traces by the intervening dielectric layer.

12. A method as recited in claim 11 wherein the filler comprises an epoxy in which the metal is dispersed, the method further comprising the step of curing the epoxy prior to depositing the first photodefinable resin.

13. A method as recited in claim 11 wherein the circuit structure is a circuit board.

14. A method as recited in claim 11 wherein the circuit structure is a circuit package.

15. A method as recited in claim 11 wherein the filler consists essentially of a polymer matrix and the metal and has a substantially 100% solids content.

16. A method as recited in claim 11 further comprising the steps of:

forming a third dielectric layer on at least one of the second dielectric layers after the electroless plating step, the third dielectric layer containing a catalytic filler and overlying at least one conductor trace associated with the at least one second dielectric layer;

photoimaging and developing the third dielectric layer so as to form an opening that exposes an underlying portion of the at least one conductor trace;

forming a fourth dielectric layer on the third dielectric layer and the underlying portion of the at least one conductor trace;

photoimaging and developing the fourth dielectric layer so as to expose a portion of the third dielectric layer and re-expose the underlying portion of the at least one conductor trace;

treating the portion of the third dielectric layer such that the catalytic filler in the third dielectric layer causes the portion to be electrolessly plateable; and electrolessly plating copper on the portion of the third dielectric layer and the underlying portion of the at least one conductor trace so as to yield a multilayer structure on one side of the double-sided circuit structure.

17. A method as recited in claim 11 wherein the substrate is formed to include an etched conductor pattern on at least one of the surfaces thereof, wherein the first photodefinable resin is deposited over the etched conductor pattern and the first dielectric layer overlying the etched conductor pattern electrically insulates the etched conductor pattern from the conductor traces formed on the first dielectric layer.

* * * * *